United States Patent [19]
Lewis, Jr. et al.

[11] 3,974,518

[45] Aug. 10, 1976

[54] ENCAPSULATION FOR HIGH FREQUENCY SEMICONDUCTOR DEVICE

[75] Inventors: Basil Charles Lewis, Jr.; James Robert Mathews; Louis Henry Von Ohlsen, Jr., all of Reading, Pa.

[73] Assignee: Bell Telephone Laboratories, Incorporated, Murray Hill, N.J.

[22] Filed: Feb. 21, 1975

[21] Appl. No.: 551,991

[52] U.S. Cl. .................................. 357/81; 357/80; 357/74
[51] Int. Cl.² .................. H01L 39/02; H01L 23/02
[58] Field of Search .......................... 357/80, 81, 74

[56] References Cited
UNITED STATES PATENTS

| 3,515,952 | 6/1970 | Robinson | 357/80 |
|---|---|---|---|
| 3,710,202 | 1/1973 | Leidich et al. | 357/80 |

OTHER PUBLICATIONS

Proceeding IEEE – 8/72 – pp. 1014–1015, "Embedded Diamond Heat Sinks . . . ".

Primary Examiner—Edward J. Wojciechowicz
Attorney, Agent, or Firm—H. W. Lockhart

[57] ABSTRACT

An hermetic sealed microwave diode package having high thermal conductivity and very low parasitic impedances. The diode chip is mounted upon a diamond member embedded in a copper base member so that the diamond mounting surface and the copper base member surface are coplanar. A fused silica insulator ring produced by selective grit blasting surrounds the chip and is mounted likewise entirely on the diamond surface. The silica insulator has a height comparable to the thickness of the semiconductor chip and the enclosure is completed by a metal covering member which includes a contact to the top surface of the diode chip. The package thereby has extremely short conductive paths and low capacitance by virtue of the very small silica insulator ring.

3 Claims, 3 Drawing Figures

ENCAPSULATION FOR HIGH FREQUENCY SEMICONDUCTOR DEVICE

This invention relates to encapsulations for high frequency, relatively high power semiconductor diodes, and particularly for such devices for use at about 10 GHz and above which also require high thermal dissipation.

BACKGROUND OF THE INVENTION

High frequency diode encapsulations are presently known in the art for satisfactory operation at high frequencies. Other packages are available for operation at relatively high powers. Encapsulations for such applications however, thus far, do not combine in one package all of the characteristics required for both high frequency and high power operation.

In particular, high performance microwave diodes for use at X-band (9.2–12 GHz) and above, require the combination of hermeticity, thermal conductivity and mechanical strength coupled with very small dimensions. Certain packages known in the art provide hermeticity and mechanical strength but present large parasitic impedances and thermal resistances which make them unsuitable for high performance in the above-mentioned high frequency range. Other packages having more acceptable parasitic impedances and satisfactory thermal dissipation characteristics lack the other requirements of hermeticity and mechanical strength.

Solid state device packages exhibit both capacitance and inductance in use to some degree. The presence of unduly long conductive paths contributes to parasitic inductance. Typically, semiconductor diode housings utilizing relatively long cylindrical housings with end terminals have increased package inductance. On the other hand, short cylindrical housings are difficult to manufacture to precise dimensional tolerances. Glass and ceramics customarily used for such cylinders have relatively higher dielectric constants thus increasing the parasitic capacitance, particularly when the distance between the terminal ends of the package is decreased. Accordingly, there is need for a semiconductor diode package which meets and solves the foregoing encapsulation problems.

SUMMARY OF THE INVENTION

In accordance with this invention, a semiconductor diode package is made using semiconductor device fabrication concepts to fabricate very short insulators of fused silica or quartz by batch fabrication to very small dimensional tolerances. Quartz has a relatively low dielectric constant to counter the increase in parasitic capacitance occasioned by the reduction in package length or height. The base or mounting platform for the diode has extremely high thermal conductance by virtue of a diamond mounting element which is embedded in a copper base member so as to provide excellent thermal conductance therebetween. The semiconductor device housing is formed entirely within the periphery of the diamond mounting element and comprises, in addition to the quartz insulator, a simple metal ring contact member and metal cover plate. The several members of the package then are bonded together using pressure bonding with suitably plated interfaces. Low parasitic impedances are realized by virtue of the very small size of the quartz insulator which is comparable to the thickness of the semiconductor chip. This dimensional factor enables reduction in the length of the contact lead from semiconductor device to package terminal thus minimizing package inductance. Despite the extremely small overall dimensions of the encapsulation, excellent thermal dissipation and matching of thermal expansion coefficients is realized, as a consequence of the close coupling of the diode chip to the diamond base to which the entire package likewise is mounted.

BRIEF DESCRIPTION OF THE DRAWING

The invention and its objects and features will be more clearly understood from the following detailed description taken in conjunction with the drawing in which.

DETAILED DESCRIPTION

Figure 1:
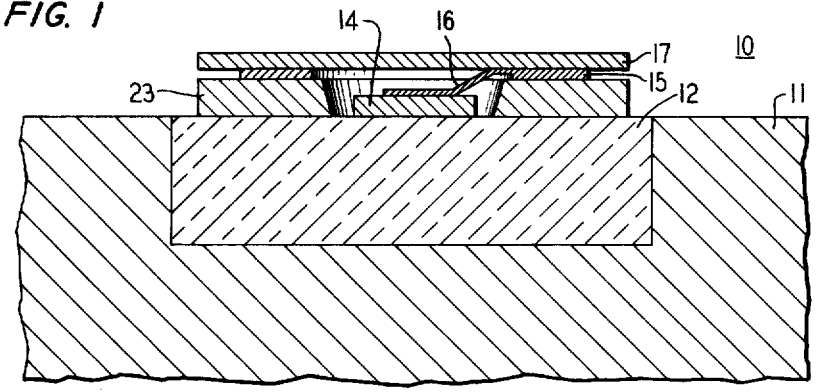
FIG. 1 is an elevation in cross section of a semiconductor diode encapsulation in one embodiment in accordance with this invention.

Referring to FIG. 1, in one embodiment, the encapsulation 10 comprises a relatively large metallic base member 11, typically of gold plated copper. This member is the handle for the device and has good thermal conductance as well as physical characteristics suitable for embedding therein the diamond element 12.

The diamond mounting element 12 is embedded in the copper element 11 by the application of pressure, and intimate contact between the two members is enhanced by suitable metallic layers, typically gold, on both members. In a typical encapsulation for use in the 10 GHz range and above, the diamond element is 0.89 millimeters square and 0.63 millimeters high. The semiconductor diode element or chip 14 is mounted directly to the diamond element and may comprise any one of various types of high frequency two-thermal solid state devices. The chip 14 typically is about 0.025 millimeters thick and about 0.03 to 0.05 millimeters in diameter. In particular, the device may be of the pn junction type or of the metallic barrier or Schottky type and may contain one or more such rectifying barriers. Likewise such an element may be of silicon or germanium or other of the well known semi-conductor materials, such as gallium arsenide and other compound semiconductor materials.

The encapsulation for the diode element comprises the quartz insulator element 23, the metallic contact ring 15 and the cover member 17, which likewise is of metal. The contact ring 15 includes a portion which projects radially from the ring to form a contact finger 16 which is deflected downward to an extent necessary to make an electrical contact to the upper face of the diode element 14. These parts comprising the housing, namely the insulator 23, contact ring 15, and cover member 17 are joined to the diamond base and to each other by compression bonding as will be described in more detail hereinafter. Lead inductance is minimized by the shortness of the contact finger 16 in relation to its width. Other particular contact arrangements may be used, including, in the extreme, a membrane-like member making contact centrally to the upper face of the chip 14.

Referring again to the copper base member 11, this element in one embodiment is a cylinder 3.81 millimeters in diameter and 2.41 millimeters long. It is prepared for the embedding step by a cleaning operation followed by the application of a nickel plate about 1.8 microns thick, and then a gold plate about four microns thick. The diamond element previously referred to is likewise prepared for the embedding step by a stringent cleaning operation and a metalization comprising a first layer of titanium sputtered to a thickness of about 600 A followed by platinum layer having a thickness of about 2500 A. These operations are repeated on the shadowed side, followed by a double gold evaporation deposition to provide a thickness in excess of one micron.

In accordance with the art, the diamond element 12 then is embedded in the copper base member 11 using a suitable press. This process produces intimate contact of the diamond element 12 and the copper base element 11 and leaves the surface of the diamond element substantially coplanar with the upper surface of the copper base element 11.

Figure 2:
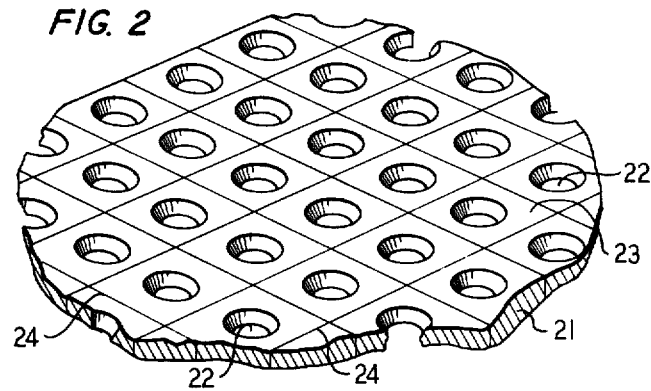
FIG. 2 is a perspective view of a portion of a quartz substrate from which an array of the quartz insulator members are fabricated for use in accordance with this invention.

The insulator member 23 is fabricated from a fused silica (quartz) substrate, a portion of which is shown in FIG. 2. Typically, such a substrate may have a thickness between 0.050 and 0.115 millimeters and is about 0.50 millimeters square. It is optically polished on both faces to enhance the formation of hermetic seals during subsequent thermocompression bonding. This substrate is fashioned into the individual insulator elements 23 by two fabrication steps following stringent cleaning and metalization using layers of chromium, platinum and gold. First, a grit-blasting operatin is used to form an array of holes 22 in the metallized slice. During this step the substrate 21 is cemented down to a glass base and a thick metal mask, for example, of molybdenum, about 0.127 millimeters thick, is placed on the upper face of the quartz substrate. The mask contains an array of holes each having a diameter of about 0.165 millimeters located on 0.559 millimeter centers. The mask is cemented in place together with a properly designed retainer to prevent bowing and lifting of the mask and to enhance control of subsequent dimensions and the assembly is placed in a grit-blasting facility. Nozzles located about nine centimeters above the mask surface direct a stream of aluminum oxide abrasive (Norton 320/400) under 24 psi pressure onto the slice. The total processing time may vary from about 20 to 40 minutes depending upon the condition of the abrasive and the cycling of the elements of the fabrication process. The process is generally halted when the bottom of the slightly tapered holes in the quartz slice have a diameter of at least 0.152 millimeters as observed using back-lighting and a microscope reticule.

Following satisfactory fabrication of the array of holes the quartz slice is separated into discrete elements 23 by diamond sawing along the orthogonally disposed lines 24. Such separation is accomplished using precision cutting facilities of the type generally available in the semiconductor device industry. For the hole dimensions recited above the overall insulator dimensions are from 0.476 to 0.532 millimeters square. Following the separation step the individual insulator elements are cleaned and deburred using ultrasonic and other conventional cleaning procedures. The final product is an insulator element 23 having a gold surface on both opposed faces and a substantially centrally-disposed, slightly tapered hole to accommodate the semiconductor chip. The maximum and minimum thickness dimensions for the insulator member are governed to a considerable extent by the fragility of the quartz material weighed against the frequency requirements of the finished device. The upper thickness limit, about 0.115 millimeters, is suitable for X-band applications and the quartz withstands fabrication processing well. For applications in the 100 to 130 GHz range the lower thickness limit, about 0.050 millimeters, must be approached and fabrication processing, particularly pressure bonding is done with care.

Figure 3:
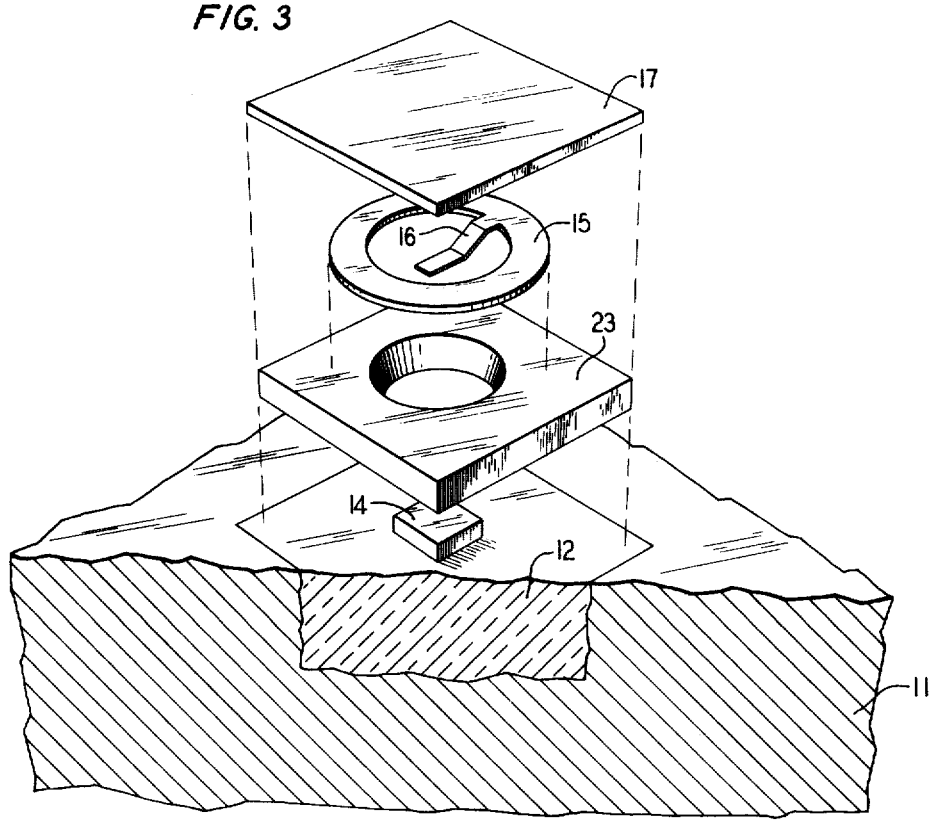
FIG. 3 is an exploded view in perspective of the embodiment of FIG. 1.

The metal contact member 15 with contact finger 16 as shown in FIG. 3, is formed using semiconductor metal film patterning technology. A polished silicon slice is metalized on one side with 1,000 A of evaporated titanium and 5,000 A of evaporated gold. Then additional gold is plated thereon to a thickness of from eight to ten microns after which a photoresist film is applied. The photoresist film then is developed in accordance with a pattern array defining the ring 15 and contact finger 16. Following the standard photolithographing and etching procedures, a metal pattern is developed in the gold-titanium film comprising an array of contact elements. Alternatively, the pattern may be formed in the metal using the masking and sputter-etching procedure disclosed in U.S. Pat. No. 3,808,108 to G. K. Herb and E. F. Labuda. Finally, the silicon backing piece and titanium layer are etched away leaving the individual contact elements 15 of gold foil, which after suitable cleaning and heat treatment are ready for the assembly process.

The cover member 17 is fabricated by shearing an iron-nickel-cobalt ribbon 0.508 millimeters wide by 0.076 millimeters thick into 0.508 millimeter squares. The ribbon has been previously gold plated to a thickness of 5 microns. After cleaning, the cover member likewise is suitable for the assembly process.

The assembly process consists of a series of steps, the first being embedding of the diamond element 12 into the copper base 11 as previously described. Next, the quartz insulator 23 is bonded by thermocompression bonding to the surface of the embedded diamond. For this step it is important that the embedded diamond have a smooth metalized surface. Typically the finish, which results from the highly polished embedding tool has been found satisfactory.

Next, the semiconductor chip or element 14 is placed within the insulator 23 in a substantially central location and the contact element 15 is placed on top of the insulator 23. Using a suitable tool, the centrally-disposed contact finger 16 is thermocompression bonded to the metalized upper terminal surface of the semiconductor element 14, and, at the same time, the lower face of the diode element is bonded to the gold-plated face of the diamond mounting element 12.

Finally, the cover member 17 is positioned over the contact element 15 and final closure of the encapsulation by thermocompression bonding is made.

In a typical package having dimensions of the order set forth above, the electrical parasitics were extremely minimal being measured at 0.067 nanohenries package series inductance, and 0.09 picofarads package capacitance. The extremely small package achieves the foregoing parasitic impedances while at the same time enjoying the considerable reduction in thermal impedance and matching of thermal coefficients contributed by the diamond mounting element embedded in the copper base. The extremely small size of the package renders measurement of hermeticity difficult so that, in addition to visual inspection for insulator cracks, detection has relied upon pressurized penetrant dye techniques for detection of leaks down to a minimum leak rate of $10^{-5}$ standard atmospheric cubic centimeters per second. Encapsulations have also passed these inspections which have been subjected to axial mechanical loads over 1500 grams and shear loads over 200 grams as well as to thermal shock tests (0° to 100° C) and temperature cycling tests (−40° to 100° C). Capability for meeting these thermal tests is made possible by the matching thermal expansion coefficients of the quartz, diamond and iron-nickel-cobalt alloy cover.

What is claimed is:

1. A semiconductor device suitable for high frequency applications in excess of about 10 GHz having an hermetic encapsulation including a metallic base member having high thermal and electrical conductivity, a diamond member embedded within said base member and having a substantially plane surface which is coplanar with a surface of said base member, a semiconductor diode chip mounted on said plane surface of said diamond member in electrical and thermal contact therewith, an annular insulating member surrounding said chip and mounted entirely within the periphery of said diamond member and having a thickness substantially equal to the height of said chip, and a conductive cover member sealed to the upper surface of said insulating member.

2. A semiconductor device in accordance with claim 1 in which said annular insulating member has a maximum peripheral dimension not in excess of about 0.540 millimeter and a thickness of about 0.05 to about 0.115 millimeter.

3. A semiconductor device in accordance with claim 1 in which said annular insulating member is composed of fused silica.

* * * * *